(12) United States Patent
Lindsey et al.

(10) Patent No.: US 11,680,993 B2
(45) Date of Patent: Jun. 20, 2023

(54) ACTIVE CURRENT MONITOR

(71) Applicant: LINDSEY MANUFACTURING CO., Azusa, CA (US)

(72) Inventors: Keith E. Lindsey, La Canada, CA (US); John McCall, Rancho Cucamonga, CA (US); An-Chyun Wang, Cerritos, CA (US)

(73) Assignee: LINDSEY MANUFACTURING CO., Azusa, CA (US)

( * ) Notice: Subject to any disclaimer, the term of this patent is extended or adjusted under 35 U.S.C. 154(b) by 0 days.

(21) Appl. No.: 17/234,199

(22) Filed: Apr. 19, 2021

(65) Prior Publication Data

US 2021/0239769 A1 Aug. 5, 2021

Related U.S. Application Data

(63) Continuation of application No. 16/035,511, filed on Jul. 13, 2018, now Pat. No. 10,983,173.

(51) Int. Cl.
*G01R 31/50* (2020.01)
*G01R 19/00* (2006.01)

(52) U.S. Cl.
CPC .............. *G01R 31/50* (2020.01); *G01R 19/00* (2013.01)

(58) Field of Classification Search
None
See application file for complete search history.

(56) References Cited

U.S. PATENT DOCUMENTS

| | | |
|---|---|---|
| 4,700,123 A | 10/1987 | Beling |
| 4,859,925 A | 8/1989 | Beling |
| 5,973,501 A * | 10/1999 | Reichard ................ G01R 23/20 324/253 |
| 6,094,044 A * | 7/2000 | Kustera .................. G01R 15/18 324/127 |
| 6,366,076 B1 * | 4/2002 | Karrer ................... G01R 15/181 324/117 R |
| 6,618,684 B1 * | 9/2003 | Beroset ................ G01R 11/185 702/99 |
| 8,165,832 B1 * | 4/2012 | Low ..................... G01R 21/133 702/60 |

(Continued)

FOREIGN PATENT DOCUMENTS

WO  WO 2017/078525 A1  5/2017

OTHER PUBLICATIONS

Extended European Search Report from related European Application No. 19833527.5, Extended European Search Report dated Feb. 2, 2022 (8 pgs.).

(Continued)

*Primary Examiner* — Jas A Sanghera
(74) *Attorney, Agent, or Firm* — Lewis Roca Rothgerber Christie LLP

(57) ABSTRACT

A current monitor for a transmission line having powered active components is provided. A current monitor includes: a housing configured to be coupled to a transmission line, an inductive current sensor in the housing configured to measure a value of the current on the transmission line to generate a sensor signal, a power source, and a sensor signal conversion circuit in the housing configured to receive power from the power source and to generate a current output signal based on the sensor signal, the current output signal having a natively useful form.

15 Claims, 7 Drawing Sheets

(56) References Cited

U.S. PATENT DOCUMENTS

| | | | |
|---|---|---|---|
| 10,983,173 B2* | 4/2021 | Lindsey | G01R 15/142 |
| 2006/0167639 A1 | 7/2006 | Mori | |
| 2009/0015239 A1* | 1/2009 | Georgiou | G01R 15/14 |
| | | | 324/105 |
| 2009/0284250 A1* | 11/2009 | Rittmann | G01R 35/005 |
| | | | 324/130 |
| 2010/0253318 A1 | 10/2010 | Thomas, Sr. | |
| 2011/0288799 A1* | 11/2011 | Cortes | G01R 33/072 |
| | | | 702/65 |
| 2014/0125354 A1* | 5/2014 | Mason | G01R 15/16 |
| | | | 324/686 |
| 2014/0253108 A1* | 9/2014 | Singh | G01R 15/181 |
| | | | 324/227 |
| 2015/0002138 A1 | 1/2015 | Fox | |
| 2016/0223595 A1 | 8/2016 | Tsujimoto | |
| 2018/0113161 A1* | 4/2018 | Hines | G01R 15/148 |
| 2018/0340964 A1 | 11/2018 | Ranucci | |

OTHER PUBLICATIONS

International Search Report from corresponding International Patent Application No. PCT/US19/41417, International Search Report dated Sep. 18, 2019 and dated Oct. 18, 2019 (3 pgs.).
Written Opinion from corresponding International Patent Application No. PCT/US19/41417, Written Opinion dated Oct. 18, 2019 (6 pgs.).

* cited by examiner

ACTIVE CURRENT MONITOR

CROSS-REFERENCE TO RELATED APPLICATION

This application is a continuation of U.S. patent application Ser. No. 16/035,511, filed on Jul. 13, 2018, the entire disclosure of which is incorporated by reference herein.

FIELD

Aspects of embodiments of the present invention relate to a wireless current and voltage monitoring insulator, and a high-accuracy voltage measuring resistor assembly.

BACKGROUND

A post insulator functions as a mechanical support between a transmission line and an electrical pole or tower while electrically insulating the transmission line from the pole or tower. For example, the post insulator may be mountable on a crossarm of an electrical pole and may be made of a ceramic or other suitable electrically insulative material. The transmission line, or conductor, may be supported on the post insulator by any of various devices, such as via bus bars, clamps, a tube-type support (e.g., the conductor may run through a tube in the post insulator), or a channel in the post insulator.

For various reasons, it may be desirable to obtain measurements of voltage and/or current of a conductor supported by a post insulator. In such instances, it may also be desirable that the voltage and/or current measurements have high accuracy and that the information may be easily transmitted. It is also desirable that voltage and/or current sensors for providing such measurements be reliable.

SUMMARY

According to an aspect of embodiments of the present disclosure, a current sensor having high accuracy and reliability is provided in a post insulator.

According to an aspect of the present disclosure, a current monitor is disclosed. The current monitor includes a housing configured to be coupled to an electric power line; an inductive current sensor in the housing configured to measure a value of a current on the electric power line to generate a sensor signal; a power source; and a sensor signal conversion circuit in the housing configured to receive power from the power source and to generate a current output signal based on the sensor signal.

In some embodiments, the sensor signal conversion circuit utilizes the received power to generate the current output signal such that the current output signal has a natively useful form.

In some embodiments, the sensor signal includes a gain change and a phase shift, and the sensor signal conversion circuit compensates the gain change and the phase shift to generate the current output signal such that the current output signal represents the value of the current on the electric power line with a constant gain and zero phase shift.

In some embodiments, the inductive current sensor does not fully surround the electric power line.

In some embodiments, the sensor signal conversion circuit comprises at least one active circuit element powered by the power from the power source, and the sensor signal conversion circuit utilizes the active circuit element for generating the current output signal.

In some embodiments, the current monitor includes a voltage sensor in the housing configured to measure a value of a voltage on the electric power line to generate a voltage sensor signal, the sensor signal conversion circuit being further configured to generate a voltage output signal based on the voltage sensor signal.

In some embodiments, the sensor signal conversion circuit comprises at least one active circuit element powered by the power from the power source, and the sensor signal conversion circuit utilizes the active circuit element for generating the voltage output signal.

In some embodiments, the sensor signal conversion circuit comprises a temperature conversion circuit powered by the power from the power source, and the sensor signal conversion circuit utilizes the temperature conversion circuit to generate the current output signal.

In some embodiments, the power source is the electric power line, the current monitor comprises a power resistor in the housing coupled to the electric power line configured to generate a power voltage from an electric power line voltage, and the sensor signal conversion circuit is configured to receive the power voltage.

In some embodiments, the sensor signal conversion circuit is configured to utilize the power voltage to generate the current output signal when little or no current is present on the electric power line.

In some embodiments, the current monitor includes a sensing resistor in the housing coupled to the electric power line configured to generate a voltage sensor signal, wherein the sensor signal conversion circuit is configured to generate a voltage output signal based on the voltage sensor signal.

In some embodiments, the power resistor shields the sensing resistor from noise or environmental temperature variation.

In some embodiments, the current monitor includes a second sensing resistor in the housing, wherein the power resistor shields the second sensing resistor from noise or environmental temperature variation, the sensing resistor is connected between the electric power line and the second sensing resistor, the second sensing resistor is connected between the sensing resistor and a common voltage, and a voltage across the second sensing resistor is utilized to generate the voltage sensor signal.

In some embodiments, the sensor signal conversion circuit is configured to utilize the power voltage to generate the voltage output signal when little or no current is present on the electric power line.

In some embodiments, the current on the electric power line has a power transmission frequency, and the current output signal comprises the value of the current on the electric power line at frequencies other than the power transmission frequency.

In some embodiments, the current output signal comprises a harmonic component of the current on the electric power line.

In some embodiments, the current output signal represents the current on the electric power line with an error of less than 0.2%.

In some embodiments, the housing is an insulator body configured to electrically isolate the electric power line from an electric power line support.

In some embodiments, the current monitor includes an output circuit configured to communicate the current output signal to an external transceiver.

In some embodiments, the output circuit comprises a surface acoustic wave device.

BRIEF DESCRIPTION OF THE DRAWINGS

The above and other features, aspects, and advantages of the present invention will become better understood with regard to the following description and accompanying drawings where.

DETAILED DESCRIPTION

In the following detailed description, certain exemplary embodiments of the present invention are shown and described, by way of illustration. As those skilled in the art would recognize, the described exemplary embodiments may be modified in various ways without departing from the spirit and scope of the present invention. Accordingly, the drawings and description are to be regarded as illustrative in nature, rather than restrictive.

Figure 1:
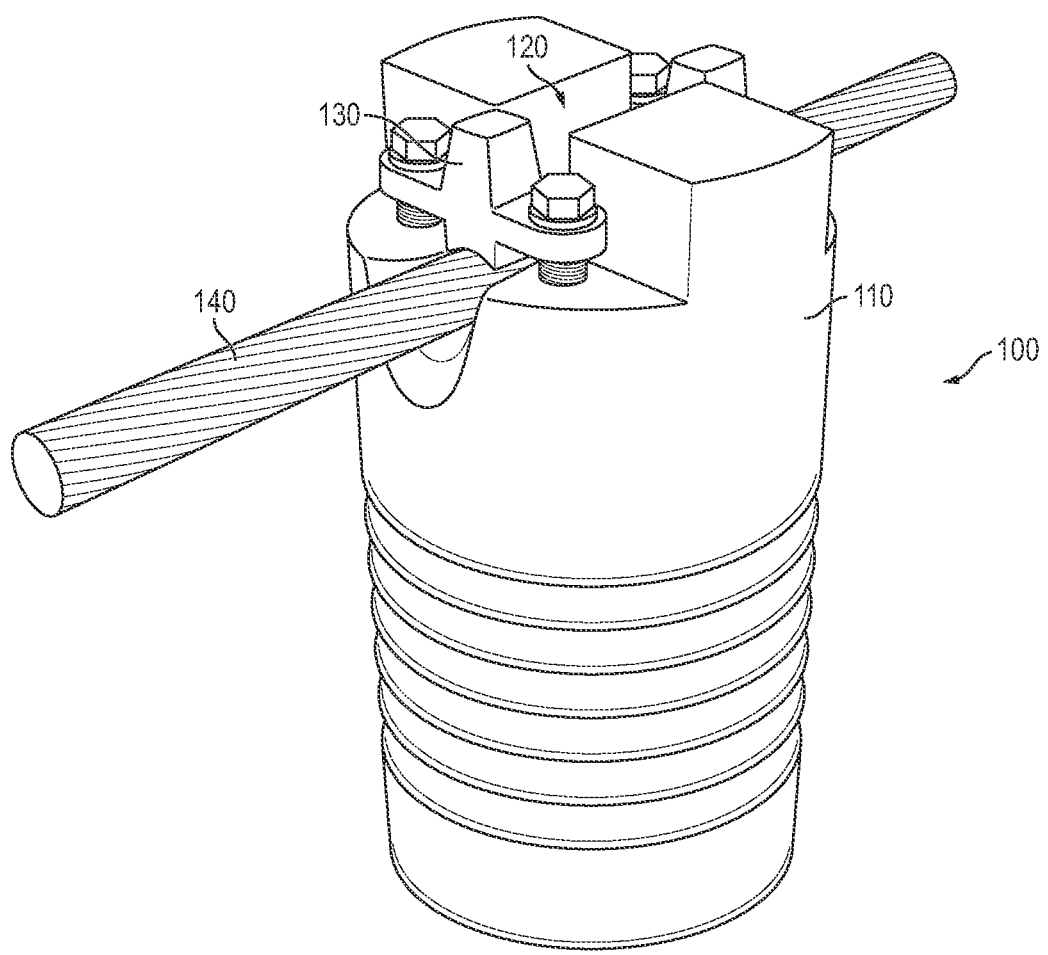
FIG. 1 is a schematic view of a current and voltage monitoring insulator according to an embodiment of the present invention.

FIG. 1 is a current and voltage monitor 100 according to embodiments of the present disclosure. While the term "current and voltage monitor" will be used throughout the specification, it is noted that in some embodiments, the current and voltage monitor may include current monitoring capabilities without voltage monitoring capabilities, or may include both current and voltage monitoring capabilities. The current and voltage monitor 100 includes a housing 110 which encloses a current sensor. The current and voltage monitor 100 may be installed on or near an electric power line used for distribution or transmission (hereinafter "a transmission line") 140 in order to measure the current present on the transmission line 140. In some embodiments, the current and voltage monitor 100 is mounted on the transmission line and supported by the transmission line (i.e., hanging from or wrapped around the transmission line). In some embodiments, the current and voltage monitor 100 is mounted on a transmission line support such as a transmission line pole or a crossarm in proximity to the transmission line 140, and the housing 110 may contact the transmission line or may have one or more lead extending from the housing 110 to the transmission line 140. In some embodiments, the housing of the current and voltage monitor 100 supports the transmission line 140.

In the embodiment shown in FIG. 1, the current and voltage monitor 100 includes a housing 110, a recess 120, and a keeper 130. The housing 110 is an insulator body made of an insulating material. The insulator body may be utilized as a post insulator to be mounted on a crossarm of a transmission line pole or tower. The housing 110, according to an embodiment, may have a recess 120 into which the conductor 140 may be received. That is, an upper region of the housing 110 may be U-shaped when viewed from a first side to define the recess 120 that extends from the first side to an opposite side. As such, the conductor 140 may be lifted into the recess 120 and supported by the current and voltage monitor 100 without being cut or requiring a jumper. However, the present invention is not limited thereto, and aspects of the present invention may also be applied to another type of post insulator, such as one having bus bars or clamps, for example.

The housing 110, in an exemplary embodiment, may be made of Polysil, a high dielectric strength polymer known and available to those skilled in the art. However, the present invention is not limited thereto, and, in other embodiments, the insulator 130 may be made of a hydrophobic cycloaliphatic epoxy (HCEP) or other suitable epoxy, for example.

The current and voltage monitor 100 may include a keeper 130 and, in an embodiment, may include a pair of keepers 130 at opposite sides of the recess 120. The keeper or keepers 130 may be configured to be removably coupled to housing 110 to retain the transmission line 140 in the recess 120.

In some embodiments, the keeper 130 is configured to provide a contact for electrically connecting to the transmission line from inside the housing 110. For example, the keeper 130 may be made of or may include a conductive material, and may attach to the housing 110 by bolts configured to be threadedly engaged in a respective pair of the threaded inserts. The keeper 130, the bolts, and the threaded inserts may all include conductive materials providing an electrical path between the transmission line in contact with the keeper and the inside of the housing 110.

The current sensor contained in the housing 110 may be an inductive current sensor. In particular, the current sensor may be an inductive sensor that does not fully encircle the transmission line 140 in order to facilitate depositing the transmission line 140 in the recess 120 without cutting the transmission line 140 or requiring a jumper.

Figure 2A:
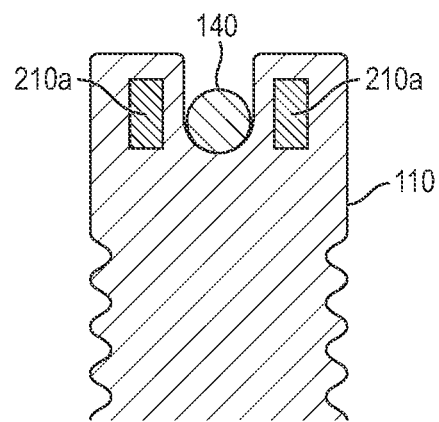
FIG. 2A is a cross section of a current monitor illustrating a dual-core inductive current sensor according to embodiments of the present disclosure.
Figure 2B:
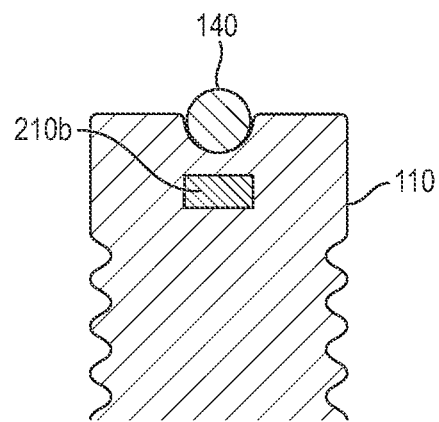
FIG. 2B is a cross section of a current monitor illustrating a single-core inductive current sensor according to embodiments of the present disclosure.
Figure 2C:
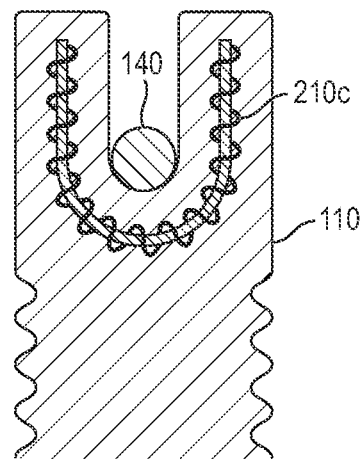
FIG. 2C is a cross section of a current monitor illustrating a Rogowski coil current sensor according to embodiments of the present disclosure.

FIGS. 2A-2C show different embodiments of a current sensor according to embodiments of the present disclosure. FIG. 2A is a cross section of a current monitor illustrating a dual-core inductive current sensor 210a according to embodiments of the present disclosure. The dual-core inductive current sensor 210a includes first and second inductive coils placed on opposite sides of the recess 120. Because the transmission line 140 is seated in the recess 120, the first and second inductive coils can be placed directly on either side of the transmission line 140. The current flowing in the transmission line 140 generates a magnetic field which in turn induces current in the dual-core inductive current sensor 210a, and the induced current is used as a current sensor signal or utilized to generate the current sensor signal.

FIG. 2B is a cross section of a current monitor illustrating a single-core inductive current sensor 210b according to embodiments of the present disclosure. The single-core inductive current sensor 210b includes a single inductive coil. The inductive coil may be placed at any point adjacent to the conductor 140. In some embodiments, the recess 120 is shallow, such that the sides of the recess are shorter than the circumference of the transmission line 140, and the single-core inductive current sensor 210b is placed directly beneath the recess 120. The current flowing in the transmission line 140 generates a magnetic field which in turn induces current in the single-core inductive current sensor 210a, and the induced current is used as a current sensor signal or utilized to generate the current sensor signal.

FIG. 2C is a cross section of a current monitor illustrating a Rogowski coil current sensor 210c according to embodiments of the present disclosure. The Rogowski coil 210c may be a single-turn, open-loop lead and a wire connected to one end of the open-loop lead and coiled around the lead along the length of the lead toward the other end. The single-turn, open-loop lead of the Rogowski coil 210c may have a U-shape and be oriented along the U-shape of the recess 120. The current flowing in a transmission line 140 in the recess 120 may induce a current in the Rogowski coil 210c which may be used as the current sensor signal or may be utilized to generate the current sensor signal. The current sensor signal generated by the Rogowski coil 210c may be a derivative of the current on the transmission line 140, and may therefore not be natively useful to other components of the current and voltage monitor 100.

Some portion of the current sensor signal, or the entire current sensor signal, generated by the current sensor may not be natively useful to other components of the current and voltage monitor 100 (e.g., for determining the current on the transmission line, communicating the determined current, or performing an action based on the determined current) without further processing. For example, the current sensor signal from the dual-core inductive current sensor 210a may have a linear gain, but may exhibit non-linear phase shift at different frequencies. The characteristics of the current sensor signal from the single-core inductive current sensor 210b may vary based on the diameter of the conductor (i.e., the larger the conductor, the further the center of the conductor from the current sensor). The current sensor signal from the Rogowski coil 210c may be a derivative of the current on the transmission line 140.

Figure 3:
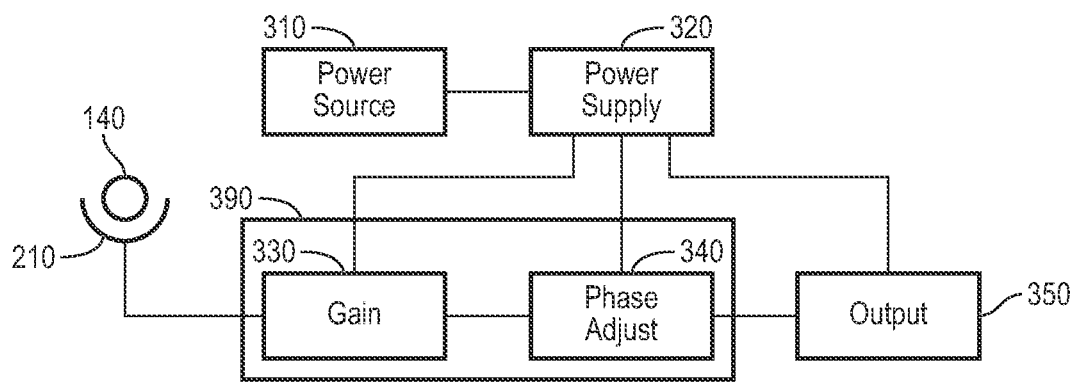
FIG. 3 is a block diagram of a current and voltage monitor according to embodiments of the present disclosure.

FIG. 3 is a block diagram of a current monitor according to embodiments of the present disclosure. The current monitor includes a current sensor 210, a power source 310, a power supply 320, a sensor signal conversion circuit 390, and an output circuit 350.

The sensor signal conversion circuit 390 and/or the output circuit may include active components. The power supply 320 utilizes power from the power source 310 to generate one or more supply voltage for the active components of sensor signal conversion circuit and/or output circuit. In some embodiments, the power source 310 may be a power resistor outputting a power voltage from the transmission line voltage, as discussed below in more detail. In other embodiments, the power source 310 may additionally or alternatively be a battery, a solar panel, an inductive energy harvesting circuit, or a combination thereof.

The current sensor 210 is an inductive current sensor which generates a current sensor signal based on the magnetic field generated by the current on the transmission line 140, such as the dual-core inductive current sensor 210a, the single-core inductive current sensor 210b, or the Rogowski coil 210c discussed above. The current sensor 210 does not completely enclose the transmission line 140. Accordingly, the current sensor signal generated by the current sensor 210 may not be natively useful (e.g., useful to the output circuit 350) without further processing.

The sensor signal conversion circuit 390, utilizing active components powered by the supply voltage from the power supply 320, receives the current sensor signal from the current sensor 210 and processes the current sensor signal into a current output signal which can be utilized by the output circuit 350, and passes the current output signal to the output circuit 350.

Figure 4A:
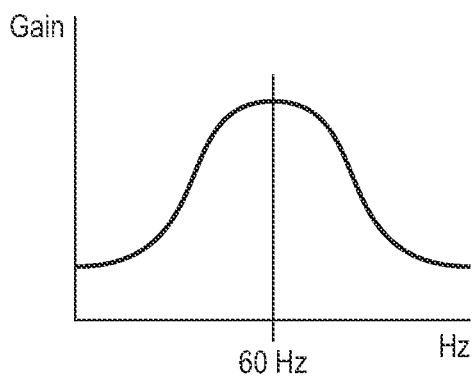
FIG. 4A is a graph showing the gain at different frequencies of a related art sensor device.
Figure 4B:
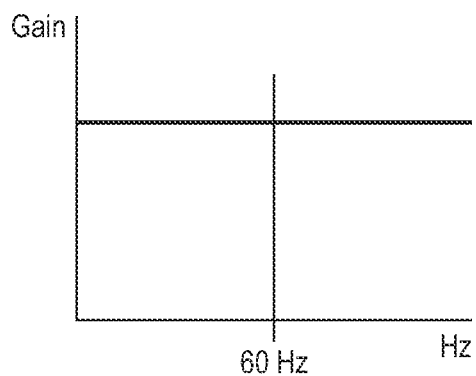
FIG. 4B is a graph showing the gain at different frequencies of a sensor signal conversion circuit according to embodiments of the present disclosure.

In one embodiment, the sensor signal conversion circuit 390 includes a gain circuit 330 and a phase adjust circuit 340. The gain circuit 330 receives the current sensor signal from the current sensor 210. FIG. 4A shows the gain at different frequencies of a related art sensor device which does not include a gain circuit 330. As can be seen, the gain may be different at different frequencies, and the device may be configured to have peak gain at the power transmission frequency (e.g., 60 Hz). A current sensor signal generated from such a configuration may include information about the power at the power transmission frequency, but may lose information related to the harmonic components located at higher and lower frequencies which may reduce the accuracy of the reading or may lose specific information provided by the harmonic components. In embodiments of the present disclosure where the gain circuit 330 utilizes active components, powered with the supply voltages generated by the power supply 320, the gain circuit 330 can provide unity gain across the relevant frequency spectrum as shown in FIG. 4B. As a result, harmonic components of the current on the transmission line containing information which may be desirable to monitor may be preserved and included in the current output signal. Passive gain components may provide gain at the frequency of the transmission line current, but may not provide the same gain to the harmonics, and this information may be lost.

Figure 4C:
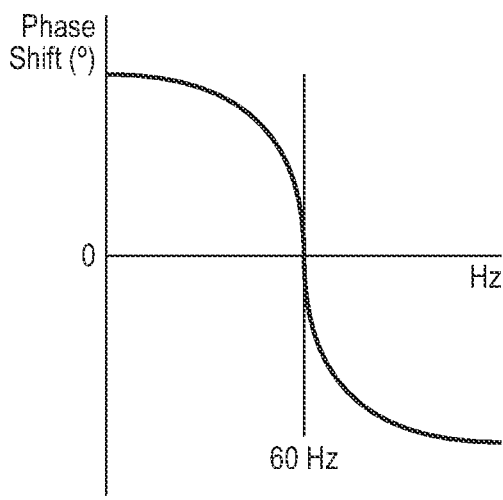
FIG. 4C is a graph showing the phase shift at different frequencies of a related art sensor device.
Figure 4D:
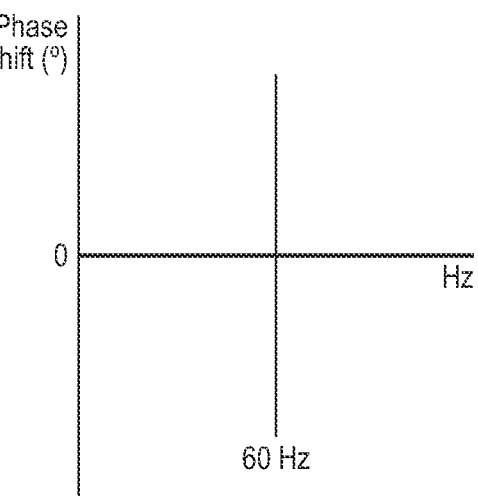
FIG. 4D is a graph showing the phase shift at different frequencies of a sensor signal conversion circuit according to embodiments of the present disclosure.

The phase adjust circuit 340 may receive the output of the gain circuit 330. FIG. 4C shows the phase shift at different frequencies of a related art sensor device which does not include a phase adjust circuit 340. As can be seen, the phase shift may be different at different frequencies, and the device may be configured to have zero phase shift at the power transmission frequency (e.g., 60 Hz). Components of the current on the transmission line at frequencies other than the power transmission frequency such as the harmonic components may be subject to phase shift, and therefore may not be captured or may not be actionable or otherwise useful without further processing. In embodiments of the present disclosure where the phase adjust circuit 340 utilizes active components, powered with the supply voltages generated by the power supply 320, the phase adjust circuit 340 may process the current sensor signal to provide zero phase shift across the entire frequency spectrum of interest as shown in FIG. 4D. As a result, harmonic components of the current on the transmission line may be recovered and/or actionable or useful.

The sensor signal conversion circuit 390 may additionally or alternatively include other active components for converting the current sensor signal into a natively useful current output signal, including but not limited to an integrator, a differentiator, a temperature compensation circuit, and/or an equation-based non-linear transform circuit.

In one embodiment, the current sensor 210 is a Rogowski coil and the sensor signal conversion circuit 390 includes an active integration circuit to compensate for the transfer function of the Rogowski coil. In some embodiments, such as embodiments utilizing the single-core inductive current sensor 210b, the sensor signal conversion circuit 390 generates the current output signal by compensating the current sensor signal based on the distance from the center of the transmission line (e.g., based on the diameter of the conductor).

In some embodiments, the sensor signal conversion circuit 390 generates the current output signal such that it represents the current on the transmission line with an error of less than 1%. In some embodiments, the sensor signal conversion circuit 390 generates the current output signal such that it represents the current on the transmission line with an error of less than 0.2% and the voltage and current monitor is used for revenue metering applications. In some embodiments, the sensor signal conversion circuit 390 is able to generate the current output signal such that it represents the current on the transmission line with an error of less than 0.2%, e.g., by accounting for the harmonic components of the current on the transmission line in the current output signal utilizing an active gain circuit and/or an active phase shift circuit. In some embodiments, the sensor signal conversion circuit 390 generates the current output signal such that it represents the current on the transmission line with an error of less than 0.2% by utilizing an active gain circuit and/or an active phase shift circuit to recover the harmonic components of the line current and by utilizing a temperature compensation circuit to correct for temperature variations.

The output circuit 350 performs an output action based on the current output signal. In some embodiments, the output circuit 350 stores the value of the current on the transmission line in a database, where the value of the current on the transmission line is determined based on the value of the current output signal. In some embodiments, the output circuit 350 includes a radio and the radio transmits the current output signal or the value of the current on the transmission line (derived from the current output signal) to an external receiver. In some embodiments, the output circuit 350 includes a line driver powered by the supply voltage from the power supply 320, and the line driver is used to transmit the current output signal or the value of the current on the transmission line. In some embodiments, the output circuit 350 includes a fiber optic communication circuit powered by the supply voltage from the power supply 320, and the fiber optic communication circuit is used to transmit the current output signal or the value of the current on the transmission line.

In some embodiments, the output circuit 350 includes an RFID circuit configured to communicate the value of the current on the transmission line, the value of the current output signal, or another measurement to an external transceiver. In some embodiments, the RFID circuit communicates an identifier (e.g., a unique identifier) for the current and voltage monitor 100 with the value or measurement. In some embodiments, the RFID circuit utilizes a surface acoustic wave ("SAW") device to perform signal processing and/or to take measurements to be communicated to the external transceiver. For example, this can be accomplished using SAW devices available from SenSanna.

Figure 5:
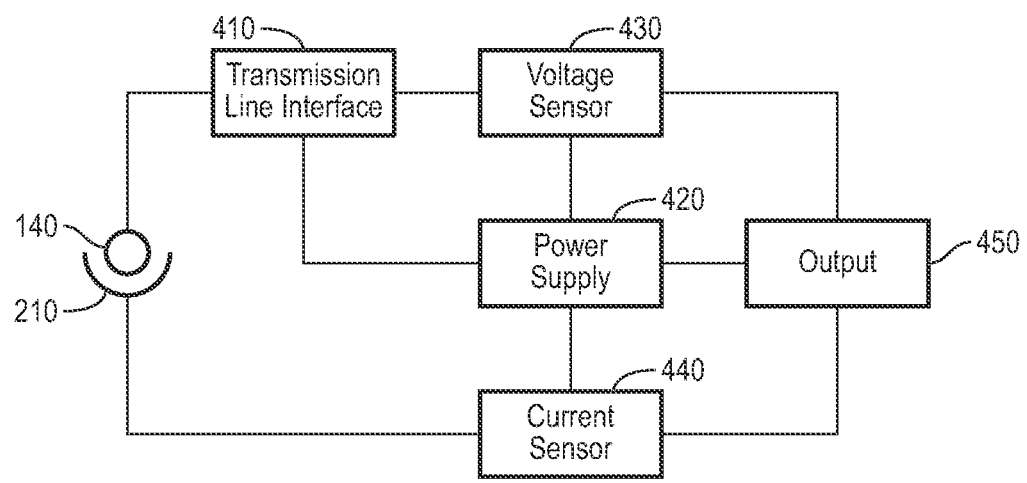
FIG. 5 is a block diagram of a current and voltage monitor according to embodiments of the present disclosure.

FIG. 5 is a block diagram of a current and voltage monitor according to embodiments of the present disclosure.

The current and voltage monitor of FIG. 5 includes a current sensor 210 sensing the current on a transmission line 140, a transmission line voltage interface 410, a power supply 420, a voltage sensor signal conversion circuit 430, a current sensor signal conversion circuit 440, and an output circuit 450.

The transmission line 140 and the transmission line voltage interface 410 may act as a power source. The transmission line voltage interface 410 generates a power voltage and a scaled voltage from the transmission line voltage. The power supply 420 utilizes the power voltage to generate one or more supply voltages which it provides to the voltage sensor signal conversion circuit 430 and the current sensor signal conversion circuit 440. When no power is delivered through a transmission line, the transmission line may still have its normal operating voltage level, but may have no current or a low level of current passing through the transmission line. In such circumstances, systems which generate power from the current on a transmission line (e.g., by inductively harvesting power) may not be able to generate power and may therefore be inoperative. Generating the power voltage from the transmission line voltage may allow the current and voltage monitor to generate the power voltage, and thereby remain operative, even when no power is being delivered through the transmission line.

The voltage sensor signal conversion circuit 430 utilizes the scaled voltage as a voltage sensor signal and generates a voltage output signal. In some embodiments, the voltage sensor signal conversion circuit 430 utilizes active components powered with a supply voltage from the power supply 420 to generate the voltage output signal. The current sensor signal conversion circuit 440 receives a current sensor signal from the current sensor 210, and utilizes active components powered with a supply voltage from the power supply 420 to generate a current sensor output signal. The sensor signal conversion circuits 430 and 440 pass the voltage output signal and the current output signal to the output circuit 450.

Figure 6A:
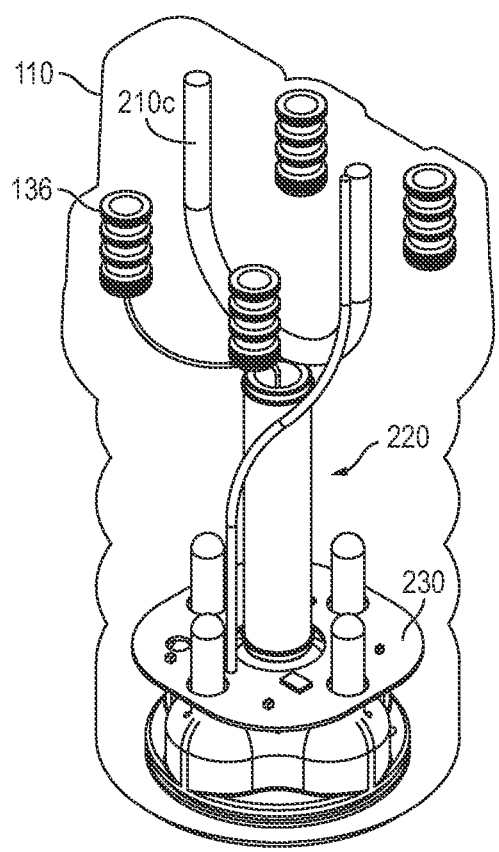
FIG. 6A is an isometric cross section view of a current and voltage monitor according to embodiments of the present disclosure.
Figure 6B:
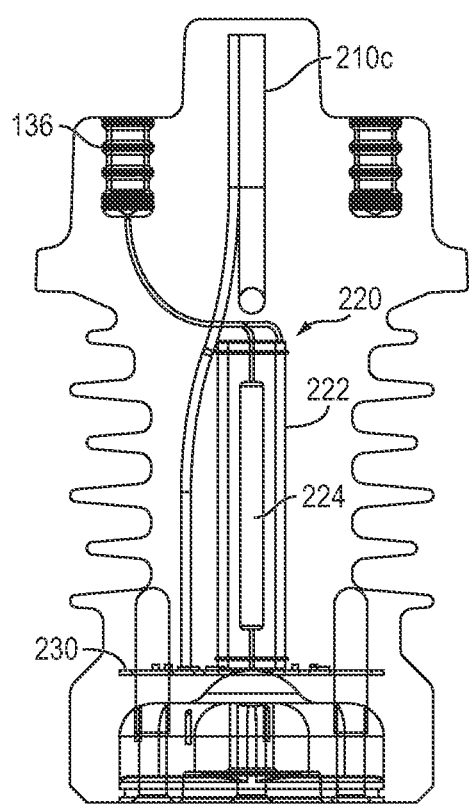
FIG. 6B is a side cross section view of a current and voltage monitor according to embodiments of the present disclosure.

FIG. 6A is an isometric cross section view of a current and voltage monitor 100 according to embodiments of the present disclosure, and FIG. 6B is a side cross section view of the current and voltage monitor 100. With reference to FIGS. 6A and 6B, the current and voltage monitor may include one or more contacts 136, a current sensor 210, a transmission line voltage interface 220, an electronics package 230, and the housing 110. Shielded wires may be used to electrically connect elements inside the housing 110 in order to prevent or reduce noise (e.g., from the transmission line 140 or neighboring transmission lines). The housing 110 houses (e.g., encapsulates) the transmission line voltage interface 220, the electronics package 230, and/or the current sensor 210.

One or more contacts 136 may provide a conductive pathway for electrically connecting objects inside the housing 110 with the transmission line 140. In some embodiments, the contact 136 is a threaded insert which threadedly engages a conductive bolt. The conductive bolt may be used to couple the current and voltage monitor 100 to the transmission line 140, such as described above with respect to the keeper, bolt, and threaded inserts of FIG. 1. In some embodiments, all of the contacts 136 may be tied together at a common potential.

The power source of FIGS. 6A and 6B may be the transmission line 140 and/or the transmission line voltage interface 220. The transmission line voltage interface 220 may electrically connect components of the current and voltage monitor 100 to the voltage on the transmission line 140 without causing the components to be damaged by the potentially high power present. In some embodiments, the transmission line voltage interface 220 includes a power resistor 222. The power resistor may be electrically coupled to the transmission line 140, for example by being electrically coupled to the contact 136, and configured to output a power voltage. The power voltage may be used to power components in the current and voltage monitor 100, which will be described in more detail below. In some embodiments, the transmission line voltage interface 220 includes a sensing resistor 224. The sensing resistor 224 may be electrically coupled to the transmission line 140, for example by being electrically coupled to a contact 136 or by being connected to the power voltage output from a power resistor 222. The sensing resistor 224 may be configured to output a voltage sensor signal corresponding to the voltage level on the transmission line 140.

Figure 7:
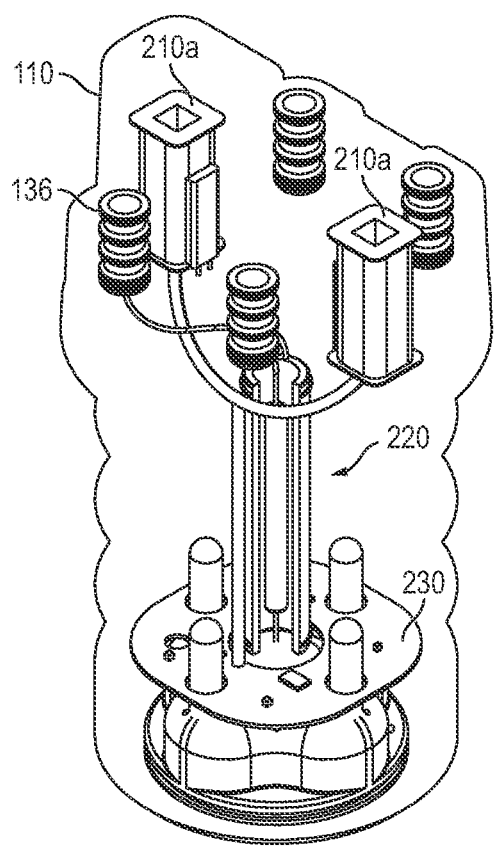
FIG. 7 is an isometric cross section view of a current and voltage monitor according to embodiments of the present disclosure.

The current sensor 210c depicted in FIGS. 6A and 6B is a Rogowski coil (e.g., a coil with an open-loop lead and a wire connected to one end of the open-loop lead and coiled around the lead along the length of the lead toward the other end). The open-loop lead of the Rogowski coil may be oriented along the U-shape of the recess 120. FIG. 7 shows an isometric cross section view of another embodiment of a current and voltage monitor according to the present disclosure, where the current sensor 210a includes first and second inductor coils in a dual-core current sensor arrangement. The first and second inductor coils 210a are positioned on opposite sides of the recess 120.

Referring again to FIGS. 6A and 6B, the electronics package 230 may be located at an end of the housing 110 opposite the end which is in contact with the transmission line 140. A ground port may be coupled to an external ground and may connect the electronics package 230 to the external ground. The electronics package 230 may receive a voltage sensor signal and/or a power voltage from the transmission line voltage interface 220, and a current sensor signal from the current sensor 210.

The electronics package 230 may include the sensor signal conversion circuit, including a current sensor signal conversion circuit and/or a voltage sensor signal conversion circuit. The electronics may also include an output circuit, e.g., a communication circuit. Any of the circuits in the electronics package 230 may be powered by the power voltage generated from the voltage on the transmission line by the transmission line voltage interface 220. The sensor signal conversion circuit may receive the current sensor signal from the current sensor 210 and may generate a current output signal based on the current sensor signal. Similarly, the sensor signal conversion circuit may receive the voltage sensor signal from the sensing resistor 224 and may generate a voltage output signal based on the voltage sensor signal. In some embodiments, the voltage sensor signal from the sensing resistor 224 can be used directly as the voltage output signal. In other embodiments, the voltage sensing circuit only includes a gain step for converting the voltage sensor signal to the voltage output signal. The communication circuit may be connected to an antenna, and may utilize the antenna to transmit the current output signal and/or the voltage output signal to a receiver. The antenna may be near to an outer surface of the housing 110 such that a signal may be transmitted easily to the receiver.

Figure 8:
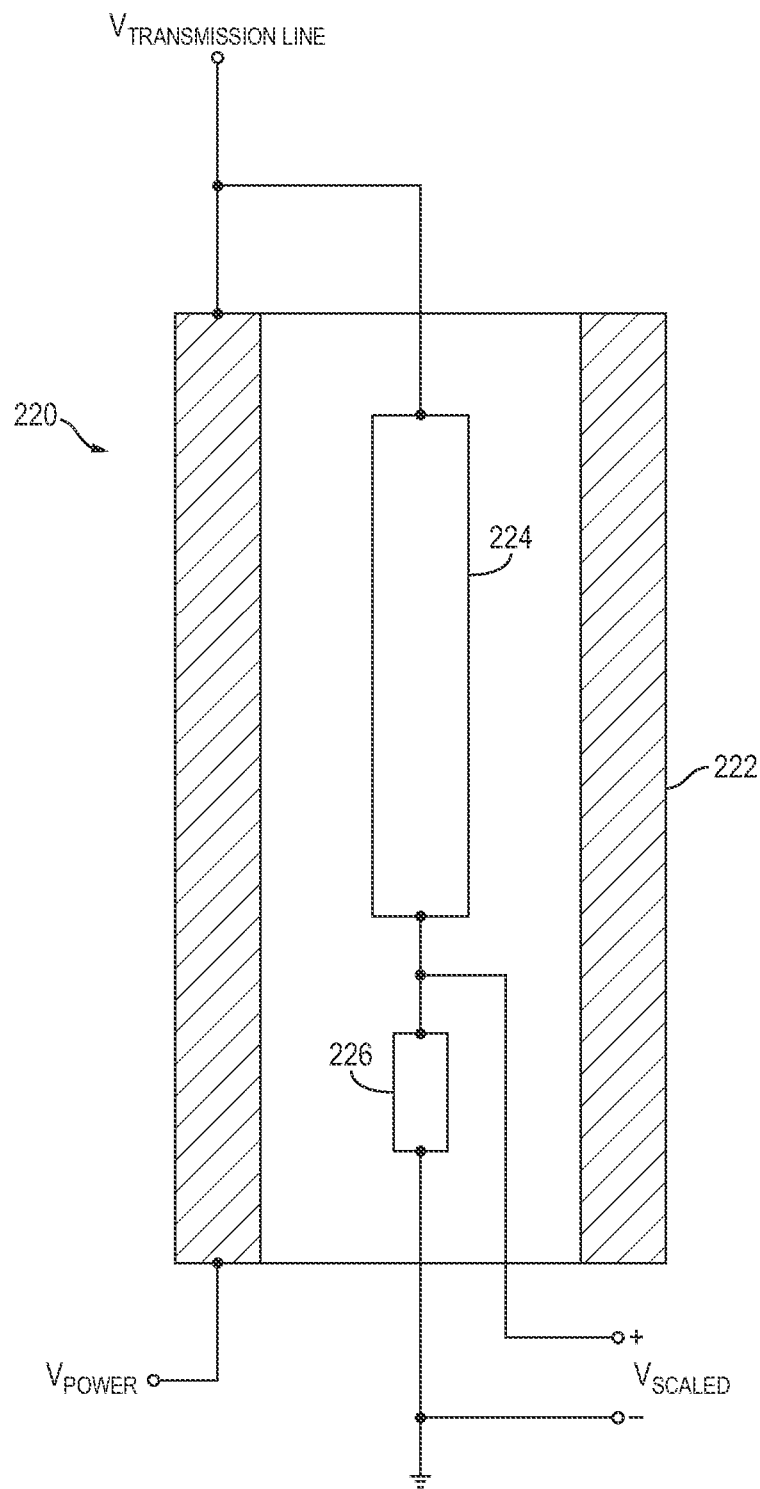
FIG. 8 is a cross section view of a transmission line interface according to embodiments of the present disclosure.

FIG. 8 is a cross section view of a transmission line voltage interface 220 according to embodiments of the present disclosure. The transmission line voltage interface 220 comprises a power resistor 222, and a first sensing resistor 224, and a second sensing resistor 226. The power resistor 222 may have a cylindrical or substantially cylindrical shape with an inner cavity defined through the middle of the power resistor 222 and openings at both ends (e.g., a tube shape). The ends of the power resistor 222 may be used as the terminals, and one terminal may be electrically connected to the transmission line to receive a transmission line voltage $V_{TRANSMISSION\ LINE}$ and the other may output a power voltage $V_{POWER}$, for example to the electronics package 230. The first sensing resistor 224 and the second sensing resistor 226 may be positioned inside the inner cavity of the power resistor 222. For example, the first sensing resistor 224 and/or the second sensing resistor 226 may have a rod shape which runs coaxially or substantially coaxially with the length of the cavity and the ends of the rod shape may be used as the terminals. One terminal of the first sensing resistor 224 may be electrically connected to the transmission line to receive a transmission line voltage $V_{TRANSMISSION\ LINE}$ and the other may be electrically connected to a terminal of the second sensing resistor 226. The other terminal of the second sensing resistor 226 may be electrically connected to ground. A scaled voltage $V_{SCALED}$ can be measured across the second sensing resistor 226, for example by the electronics package 230.

The voltage drop across a resistor such as the second sensing resistor 226 may be influenced by noise (e.g., electrical fields) from outside sources, capacitive coupling with external objects, and/or the temperature of the surrounding environment. The transmission line voltage interface 220 of FIG. 8 may utilize the first sensing resistor 224 and the second sensing resistor 226 to generate a very accurate scaled voltage $V_{SCALED}$ to determine the voltage on the transmission line. As the power resistor 222 surrounds the first sensing resistor 224 and the second sensing resistor 226, it may shield the first sensing resistor 224 and the second sensing resistor 226 from noise, such as noise from the transmission line 140 or from neighboring transmission lines, preventing that noise from impacting the scaled voltage $V_{SCALED}$. Capacitive coupling may be present between the transmission line voltage interface 220 and the housing 110, especially where the housing 110 is wet, such as when it rains. Where there is capacitive coupling between the transmission line voltage interface 220 and outside elements such as the housing 110, the capacitive coupling is with the power resistor 222, and thereby has a reduced or a nonexistent impact on the scaled voltage $V_{SCALED}$. The power resistor 222 may heat up during operation, and thereby heat its inner cavity. The heated inner cavity may provide a temperature environment for the first sensing resistor 224 and the second sensing resistor 226 which has a smaller range of possible temperatures than the environmental temperature where the current and voltage monitor 100 is installed. Accordingly, the transmission line voltage interface 220 may reduce or eliminate variations in the scaled voltage $V_{SCALED}$ caused by environmental temperature changes. As a result, the current and voltage monitor 100 utilizing the transmission line voltage interface 220 may measure the voltage on the transmission line with an error of less than 0.2%.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

Although the drawings and accompanying description illustrate certain exemplary embodiments of the present invention, it will be apparent that the novel aspects of the present invention may also be carried out by utilizing alternative structures, sizes, shapes, and/or materials in embodiments of the present invention. Also, in other embodiments, components described above with respect to one embodiment may be included together with or interchanged with those of other embodiments. Accordingly, persons skilled in the art and technology to which this invention pertains will appreciate that alterations and changes in the described structures and methods of operation can be practiced without meaningfully departing from the principles, spirit, and scope of this invention.

What is claimed is:

1. A current monitor comprising:
   a housing configured to be coupled to an electric power line;
   an inductive current sensor in the housing configured to measure a value of a current on the electric power line to generate a sensor signal;
   a power source; and
   a sensor signal conversion circuit in the housing configured to receive power from the power source and to generate a current output signal based on the sensor signal, the current output signal generated so as to represent the current on the electric power line with an error of less than 0.2% by utilizing at least one of an active gain circuit or an active phase shift circuit of the sensor signal conversion circuit.

2. The current monitor of claim 1, wherein the sensor signal conversion circuit utilizes the received power to generate the current output signal such that the current output signal has a form useable by an output circuit of the current monitor without further processing.

3. The current monitor of claim 1, wherein the sensor signal includes a gain change and a phase shift, and wherein the sensor signal conversion circuit compensates the gain change and the phase shift to generate the current output signal such that the current output signal represents the value of the current on the electric power line with a constant gain and zero phase shift.

4. The current monitor of claim 1, wherein the inductive current sensor does not fully surround the electric power line.

5. The current monitor of claim 1, wherein the sensor signal conversion circuit comprises at least one active circuit element powered by the power from the power source, and wherein the sensor signal conversion circuit utilizes the active circuit element for generating the current output signal.

6. The current monitor of claim 1, further comprising a voltage sensor in the housing configured to measure a value of a voltage on the electric power line to generate a voltage sensor signal, the sensor signal conversion circuit being further configured to generate a voltage output signal based on the voltage sensor signal.

7. The current monitor of claim 6, wherein the sensor signal conversion circuit comprises at least one active circuit element powered by the power from the power source, and wherein the sensor signal conversion circuit utilizes the active circuit element for generating the voltage output signal.

8. The current monitor of claim 1, wherein the sensor signal conversion circuit comprises a temperature conversion circuit powered by the power from the power source, and wherein the sensor signal conversion circuit utilizes the temperature conversion circuit to generate the current output signal.

9. The current monitor of claim 1, wherein:
   the power source is the electric power line,
   the current monitor comprises a power resistor in the housing coupled to the electric power line configured to generate a power voltage from an electric power line voltage, and
   the sensor signal conversion circuit is configured to receive the power voltage.

10. The current monitor of claim 9, further comprising a sensing resistor in the housing coupled to the electric power line configured to generate a voltage sensor signal, wherein the sensor signal conversion circuit is configured to generate a voltage output signal based on the voltage sensor signal.

11. The current monitor of claim 1, wherein the current on the electric power line has a power transmission frequency, and wherein the current output signal comprises the value of the current on the electric power line at frequencies other than the power transmission frequency.

12. The current monitor of claim 1, wherein the current output signal comprises a harmonic component of the current on the electric power line.

13. The current monitor of claim 1, wherein the housing is an insulator body configured to electrically isolate the electric power line from an electric power line support.

14. The current monitor of claim 1, further comprising an output circuit configured to communicate the current output signal to an external transceiver.

15. The current monitor of claim 14, wherein the output circuit comprises a surface acoustic wave device.

* * * * *